(12) United States Patent
Rossi

(10) Patent No.: US 7,760,250 B2
(45) Date of Patent: Jul. 20, 2010

(54) METHOD AND APPARATUS FOR MINIMIZING NOISE PICKUP IN IMAGE SENSORS

(75) Inventor: Giuseppe Rossi, Los Angeles, CA (US)

(73) Assignee: AltaSens, Inc., Westlake Village, CA (US)

( * ) Notice: Subject to any disclaimer, the term of this patent is extended or adjusted under 35 U.S.C. 154(b) by 367 days.

(21) Appl. No.: 11/820,880

(22) Filed: Jun. 20, 2007

(65) Prior Publication Data
US 2008/0316335 A1  Dec. 25, 2008

(51) Int. Cl.
*H04N 5/217* (2006.01)
(52) U.S. Cl. .................................. 348/241; 348/231.99
(58) Field of Classification Search ........................ None
See application file for complete search history.

(56) References Cited
U.S. PATENT DOCUMENTS 6,198,645 B1    3/2001  Kotowski et al.
6,787,749 B1    9/2004  Zhou et al.
2006/0077086 A1*  4/2006  Cringean ..................... 341/155
2007/0020869 A1*  1/2007  Han ........................... 438/381

FOREIGN PATENT DOCUMENTS

| JP | 56129419 A | * | 10/1981 |
| JP | 06053515 A | * | 2/1994 |
| JP | 10092189 A | * | 4/1998 |
| JP | 2007103691 A | * | 4/2007 |

* cited by examiner

*Primary Examiner*—David L Ometz
*Assistant Examiner*—Angel L Garces-Rivera
(74) *Attorney, Agent, or Firm*—Reed Smith LLP

(57) ABSTRACT

A method and apparatus for minimizing noise pickup in iSoC sensors using an improved Analog Capacitor Memory (ACM) design and optimized timing methods that together prevent direct connection of the electrical grounds between the low-speed signal processing circuit and high-speed signal processing circuit of an imaging System-on-Chip sensor. The ACM includes a two-terminal capacitor and two pairs of terminals. Each pair of terminals is connected via switches to separate circuits. The switches are controlled to isolate one side of the ACM from the other, thereby reducing the noise pickup between the circuits.

11 Claims, 6 Drawing Sheets

METHOD AND APPARATUS FOR MINIMIZING NOISE PICKUP IN IMAGE SENSORS

BACKGROUND OF THE INVENTION

1. Field of the Invention

The present invention relates generally to image sensors, and more particularly to a method and apparatus for minimizing noise pickup in imaging System-on-Chip (iSoC) sensors having embedded functionality with distributed signal processing at disparate operating frequencies.

2. Description of the Related Art

Visible imaging systems implemented using CMOS image sensors significantly reduce camera cost and power while improving resolution and reducing noise. The latest cameras use CMOS imaging System-on-Chip (iSoC) sensors that efficiently marry low-noise image detection and processing with a host of supporting blocks including timing controller, clock drivers, reference voltages, A/D conversion and key signal processing elements. High-performance video cameras are hence assembled using a single CMOS integrated circuit supported by only a lens and battery. These improvements translate into smaller camera size and longer battery life. The improvements also translate to the emergence of dual-use cameras that simultaneously produce high-resolution still images and high definition video.

The advantages offered by system-on-chip integration in CMOS visible imagers for emerging camera products have spurred considerable effort to further improve active-pixel sensor (APS) devices. Active-pixel sensors with on-chip analog and/or digital signal processing provide temporal noise superior to scientific-grade video systems using CCD sensors. Sophisticated iSoCs, on the other hand, are vulnerable to noise pickup inside the sensor that can increase random and fixed pattern noise.

FIG. 1 is a block diagram for a representative CMOS imaging SoC of the prior art taught by Chen (Proceedings of 10th International Conference on Pattern Recognition, 16-21 Jun. 1990, vol. 2, page(s): 286-291) that advocates extensive integration of various analog and digital circuit blocks on the same silicon substrate. The analog electronics of the iSoC therefore comprises several blocks having significantly different functionality including the pixel array, voltage and current generators supplying low-noise references throughout the device, various amplifiers having disparate gain-bandwidth and noise requirements, distributed signal processing blocks, high-speed voltage buffers driving large capacitive loads, high-resolution analog to digital converters operating at frequencies several to many orders of magnitude higher than the pixel operating frequency, and supporting memory components including analog and digital means.

Whereas there exist deficiencies in the prior art relative to delivering the full dynamic range supplied by the pixel due to coupling of excess noise into the signal path, the present invention is a major improvement that maximizes iSoC sensor performance without adding significant production cost or complicating camera design.

SUMMARY OF THE INVENTION

The present invention is a method and apparatus for minimizing noise pickup in iSoC sensors using an improved analog capacitor design and optimized timing methods that together prevent direct connection of the electrical grounds between the low-speed signal processing circuit and high-speed signal processing circuit of an imaging System-on-Chip sensor.

Specifically, the present invention replaces the MOS transistor capacitors, having their source and drains grounded, of prior art Analog Capacitor Memory (ACM) cells with either Metal-insulator-Metal (MIM) capacitors, poly-poly capacitors, or other available capacitors having two independent terminals. According to the present invention, the capacitors could even be formed using a triple-well process, with the substrate brought out with an attached lead to form a two terminal capacitor.

The present invention controls, via an embedded iSoC timing controller, the sequential charging and discharging of the ACM cells to prevent connecting the electrical grounds on one side of the ACM to the other grounds on the other side. Together these improvements prevent possible injection of ground-noise from the circuits on one side of the ACM cell to the other. Since the ACM cells are often the common bridge between circuits operating at disparate operating frequencies, high-frequency switching noise is no longer directly coupled into the low frequency circuit. In the pseudo-differential signal path of the present invention, the signal and ground paths are hence never directly connected between the low-speed column buffer and the high-speed line driver or digitization stages.

According to one embodiment of the present invention, an ACM cell comprises a capacitor having a first node and a second node, a first switch connected to the first node, a second switch connected to the second node, a third switch connected to the first node, and a fourth switch connected to the second node. The first and second switches are connected to a first circuit operating at a first frequency, and the third and fourth switches are connected to a second circuit operating at a second frequency. The first and second switches are closed and the third and fourth switches are open during a first period, and the first and second switches are open, and the third and fourth switches are closed during a second period.

An image sensor according to one embodiment of the present invention comprises a first circuit operating at a first frequency, a second circuit operating at a second frequency and a plurality of Analog Capacitor Memory (ACM) cells connecting the first and second circuits. Each ACM cell comprises a capacitor having a first node and a second node, a first switch connected to the first node, a second switch connected to the second node, a third switch connected to the first node, and a fourth switch connected to the second node, wherein the first and second switches are connected to the first circuit, and the third and fourth switches are connected to the second circuit. The first and second switches are closed and the third and fourth switches are open during a first period, and the first and second switches are open, and the third and fourth switches are closed during a second period.

A method according to the present invention of isolating ground noise between a first circuit and a second circuit in an image sensor comprises connecting the first circuit to the second circuit with at least one Analog Capacitor Memory (ACM) cell, wherein the ACM cell comprises a capacitor having a first node and a second node, a first switch connected to the first node, a second switch connected to the second node, a third switch connected to the first node, and a fourth switch connected to the second node, wherein the first and second switches are connected to the first circuit, and the third and fourth switches are connected to the second circuit;

closing the first and second switches and opening the third and fourth switches during a first period; and opening the first and second switches and closing the third and fourth switches during a second period;

wherein the at least one ACM cell isolates the first circuit from the second circuit.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

In imaging sensors, it is imperative that the noise floor be set by the pixel's intrinsic performance capability, regardless of the extent of block integration or specific design. To maximize Signal-to-Noise Ratio (SNR), the present invention teaches a solution for optimizing the signal path to strictly prevent coupling of excess noise. The solution includes forming the analog capacitor memory to facilitate pseudo-differential signal handling and clocking the signal path to eliminate direct connections between the electrical grounds of the various circuit blocks. This approach insures that no switching noise is coupled into the signal processing path.

Figure 1:
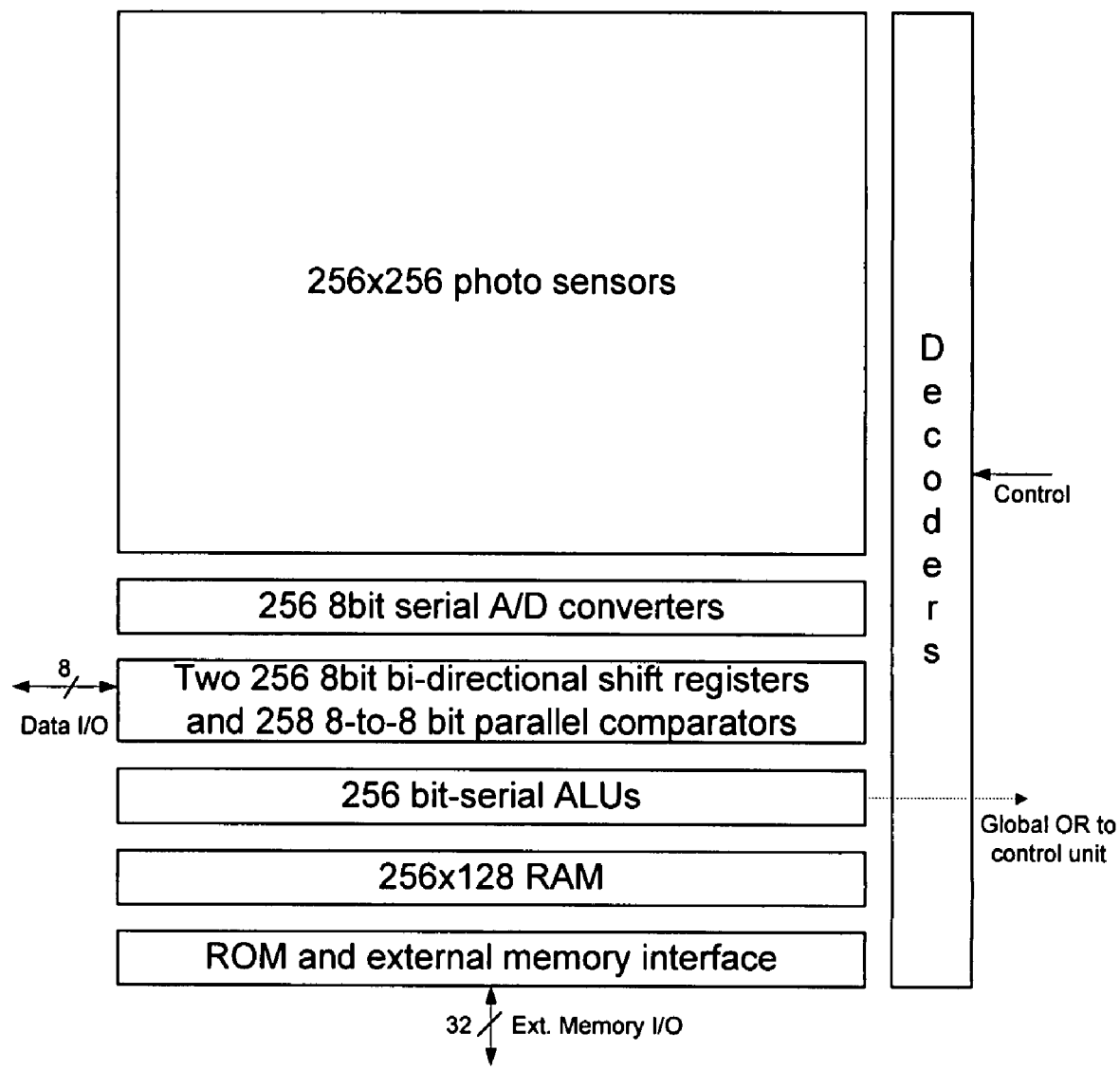
FIG. 1 is a block diagram of a prior art circuit as disclosed by Chen in Proceedings of 10th International Conference on Pattern Recognition (1970)
Figure 2:
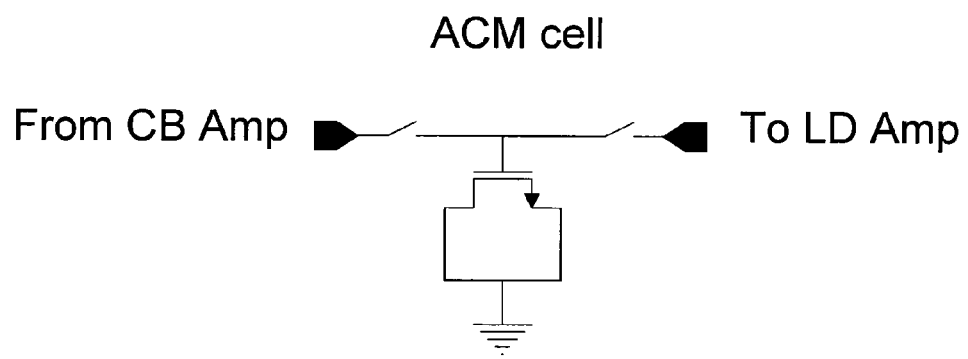
FIG. 2 is an Analog Capacitor Memory Cell of the prior art.

Accordingly, the present invention is a method and apparatus for minimizing noise coupling and inadvertent pickup in iSoC sensors wherein the signal processing chains use analog capacitors to provide temporary storage while performing various signal processing operations. The temporary storage is facilitated by using analog capacitor memory (ACM) cells that are normally formed using MOS transistors having extremely high capacitance density. Their high intrinsic capacitance minimizes the area necessary for implementation in compact integrated circuits; the result is a preference for their use. An analog capacitor memory (ACM) cell of the prior art is shown in FIG. 2. In this example, the capacitor is an NMOS transistor with its Source and Drain terminals grounded; the ACM cell is charged by enabling the switch connecting it to the Column Buffer amplifier (CB Amp) and discharged by alternately enabling the switch connecting it to the Line Driver amplifier (LD Amp).

Since the signal processing in imaging sensors supports rows and columns of imaging pixels, signal handling is first parallelized as each row is read out, and then serialized on a column-by-column basis at much higher speeds to generate the video raster. ACM cells and the supporting circuits are thus often located in banks along with the column buffers that support each column of pixels.

Figure 3:
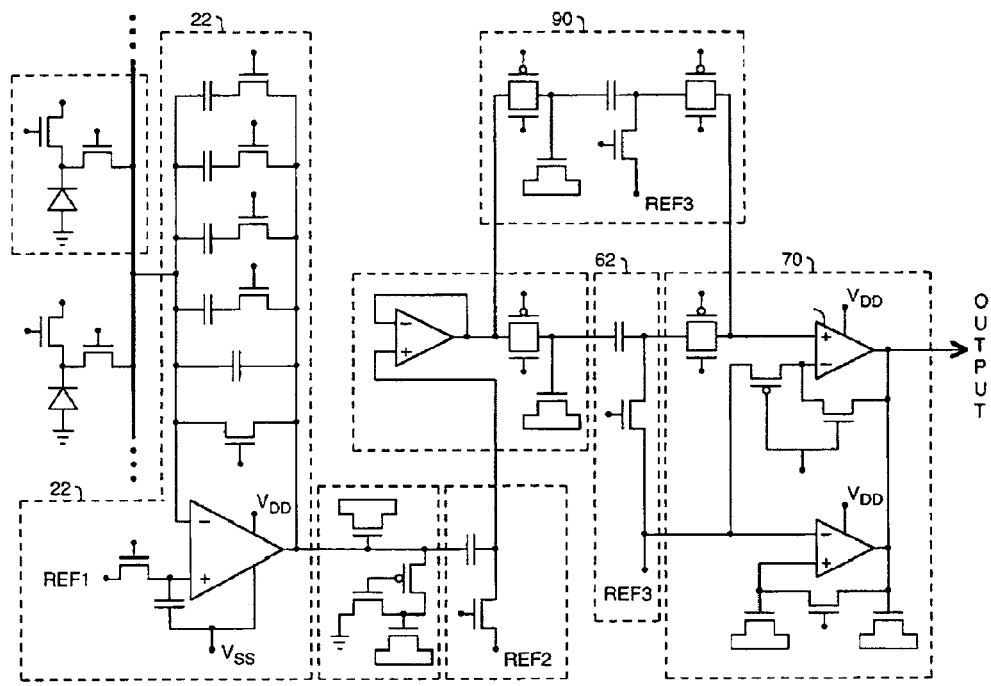
FIG. 3 is a Column Buffer of the prior art incorporating the Analog Capacitor Memory Cell of the prior art.

FIG. 3 is a column buffer (CB) of the prior art that uses ACM cells to pipeline the pixel data in circuit element 90 after initial amplification is performed in charge amplifier 22 to boost the signal prior to down-stream signal processing in correlated double sampling block 62 and dc offset suppressor 70. ACM memory hence facilitates 1) signal pipelining by alternately handling signal A from one pixel or timing epoch in a first part of the apparatus and signal B from a second pixel or timing epoch in another section of the apparatus, 2) correlated double sampling to subtract common voltage offsets, 3) temporary storage of offset voltages for subtracting offset voltages, and 4) temporary storage of the pixel signal to perform other signal processing operations. Such functions parallelize signal handling to prioritize certain operations that facilitate low-speed writing of the pixel signals into the ACM cells while reading and digitizing the content of the stored value from the bank of ACM at high speed.

Figure 4:
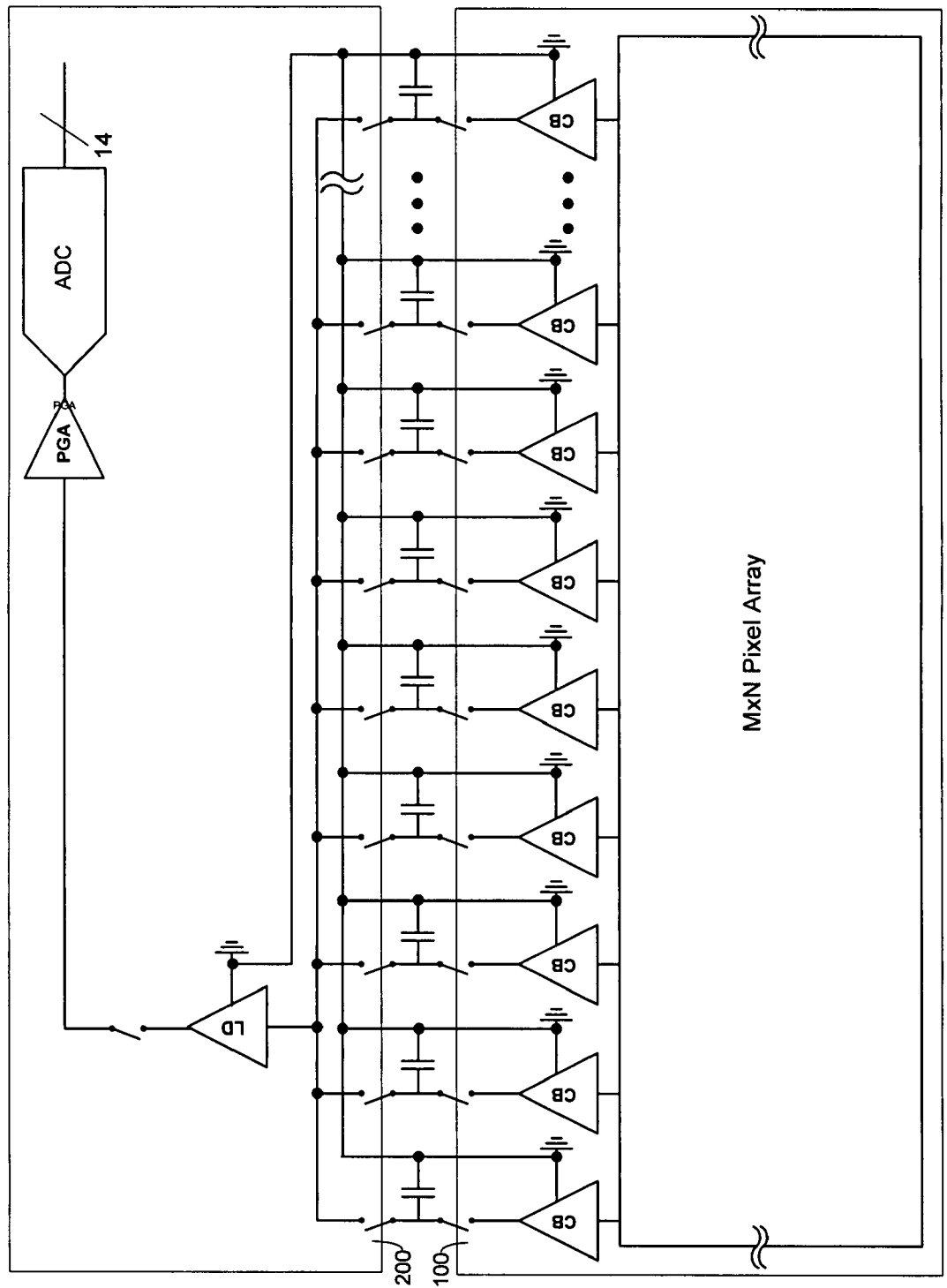
FIG. 4 is a floor plan of a prior art iSoC sensor with common ground connection between low-speed and high-speed sections via ACM implementation of the prior art.
Figure 5:
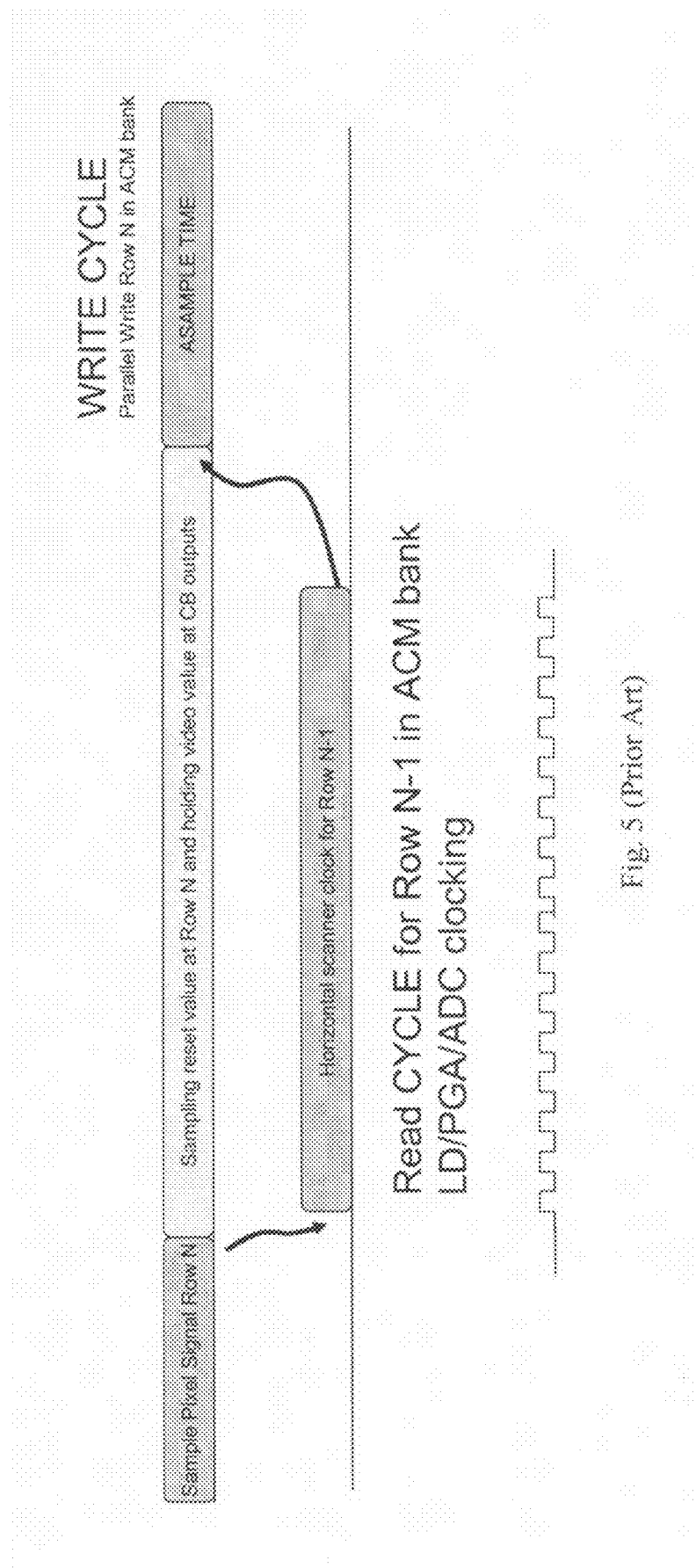
FIG. 5 is a timing diagram showing the read and write cycle for ACM banks of the prior art.

FIG. 4 is a floor plan of the prior art signal processing chain used for reading a line of pixels using parallel CB, ACM and LD circuits. The aggregate parallel circuitry multiplexes the output from the line driver at the input of a Programmable Gain Amplifier (PGA) for subsequent digitization by the A/D converter (ADC); this multiplexing is performed as each row of the imaging sensor is read. As shown in FIG. 5, read and write operations for a bank of ACM cells and column buffers are performed as follows:

The write cycle for charging each bank of ACM cells is a highly parallel, low-speed operation. Upon completion of preparatory pixel signal conditioning for Row N−1 using the column buffer, all the outputs of a bank of charge amplifiers (Column Buffer) are simultaneously sampled and stored in the corresponding ACM cells. The charge amplifier at the front-end of the column buffer is now available to handle the video signal from the next pixel row N when it is selected.

The read cycle for the bank of ACM cells is a highly serialized, high-speed operation. It is performed by a high-speed Line Driver that sequentially connects to a Read-Out Bus by the sensor's internal timing. This high-speed multiplexing of the content from Row N−1, which was earlier stored in the ACM cells, generates each line of video on the Readout Bus. The Readout Bus hence connects the Line Driver's output to the very fast digitization stage located at one of its ends; the digitizer usually comprises a Programmable Gain Amplifier (PGA) and an Analog-to-Digital Converter (ADC).

In the prior art, the Analog Capacitor Memory cell comprises single-ended NMOS transistors whose bottom plate (Source/Drain terminals) is connected to ground. The common ground is shared amongst the low-speed Column Buffer and the high-speed Line Driver circuits, as shown in FIG. 4. Consequently, the electrical ground for the composite low-speed section 100 comprising the M×N pixel array and the supporting bank of column buffers is connected to the composite high-speed section 200 through the analog capacitors. This arrangement couples high-speed switching noise from the electrical ground for circuit block 200 into the low-noise, low-speed circuit block 100, including CB and pixel array, during normal operation.

Figure 6A:
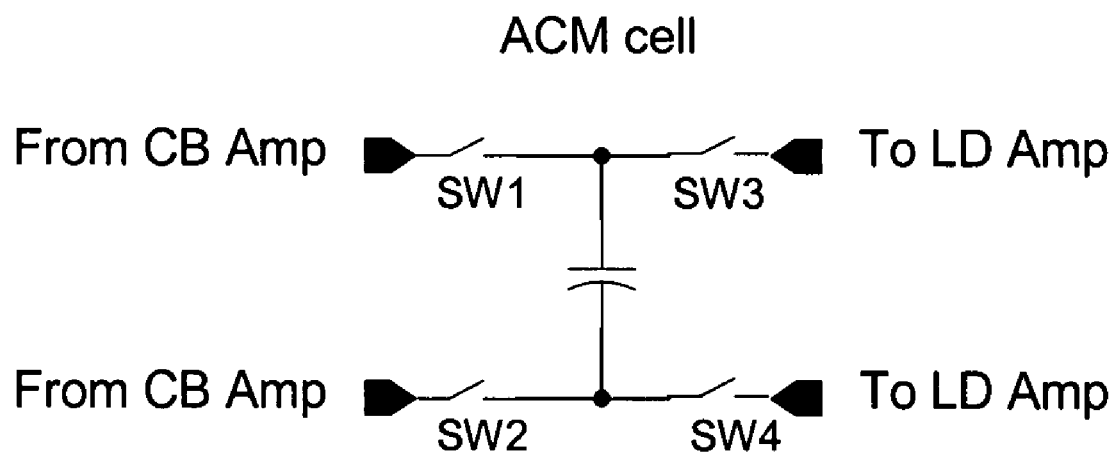
FIG. 6(A) is a diagram of an Analog Capacitor Memory Cell according to the present invention.

According to the present invention, a pseudo-differential ACM cell is used as shown in FIG. 6(A). The ACM cell preferably consists of a Metal-Insulator-Metal (MIM) capacitor having two pairs of terminals. The capacitor is a two-terminal (node) device. One node connects to two switches and the other node connects to two switches. The first terminal pair (SW1 and SW2) connect to the low-speed section, the second pair (SW3 and SW4) connect to the high speed section. During operation, each pair of terminals is alternately connected either to the low-speed section (Column Buffer) during the write operation, or to the high-speed section (Line Driver/PGA/ADC) during the read operation. This arrangement fully decouples the ground domain of the low-speed section from the ground domain of the high-speed section; injection of ground noise and ground-switching noise injection across the two ground domains is prevented during normal operation.

While a MIM capacitor is preferred, any other suitable two terminal capacitor could be utilized, such as a poly-poly capacitor. Moreover, a two terminal capacitor could be formed using a triple-well process, wherein the substrate is brought out with an attached lead to form a two terminal device.

Figure 6B:
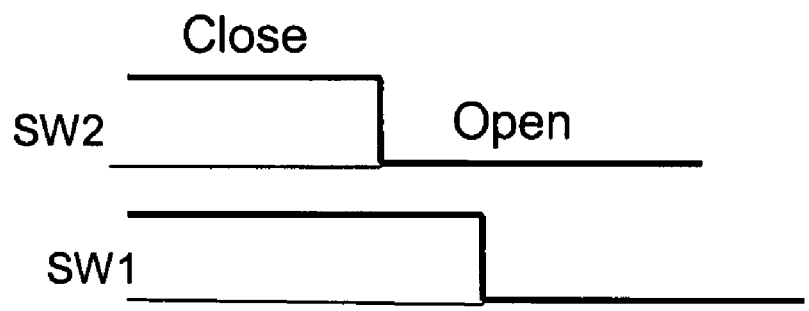
FIG. 6(B) is a switch timing diagram according to one embodiment of the present invention.

FIG. 6(B) shows the timing applied to the ACM cell during the sampling operation. By delaying the aperture of SW1 with respect to SW2, the bottom plate of the capacitor is opened first and the front plate of the capacitor later, any voltage dependent charge injection is thereby removed. Similarly, switch SW4 is opened before SW3.

Figure 7:
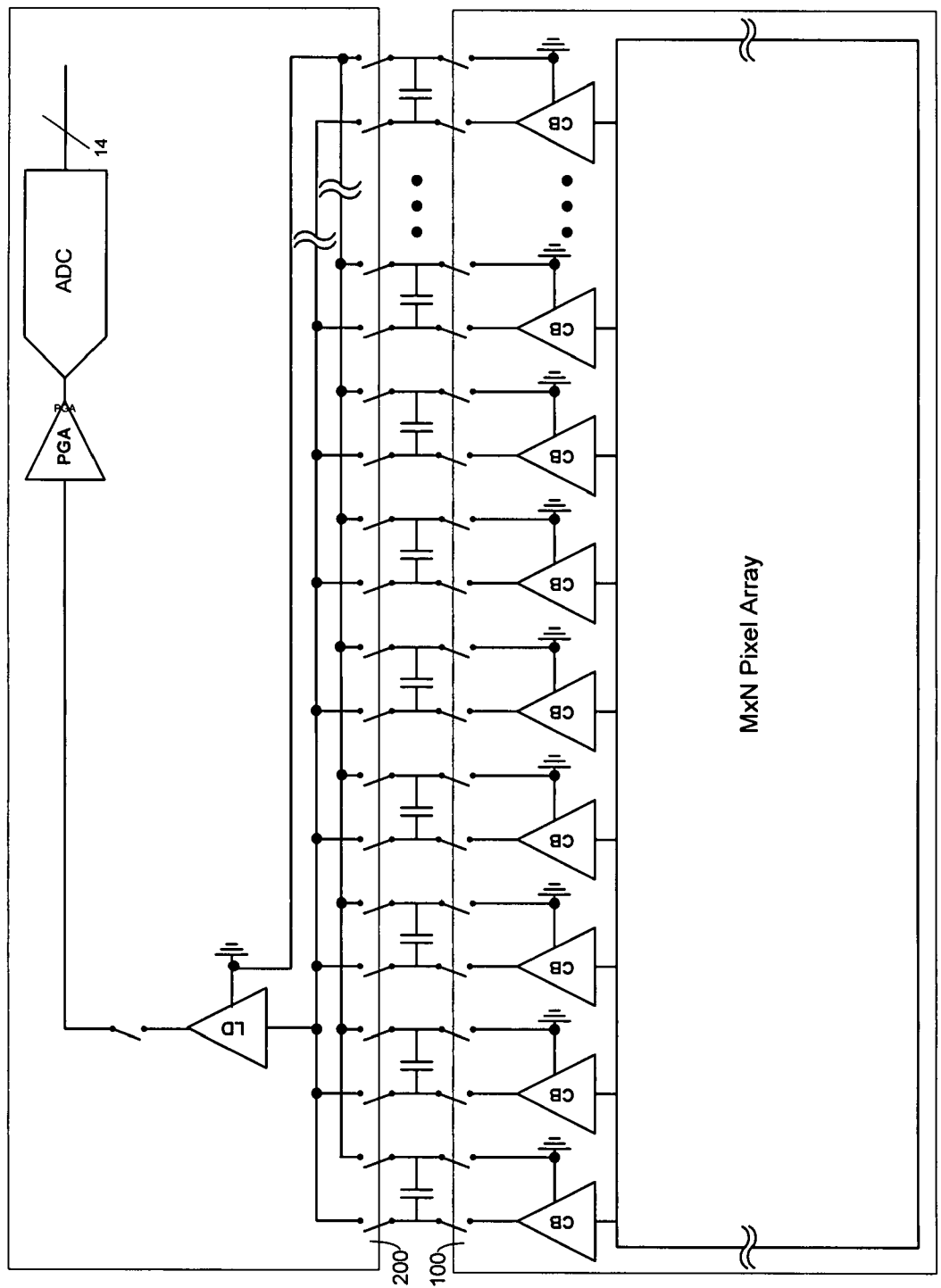
FIG. 7 is a floor plan of a preferred embodiment of the present invention including improved ACM implementation and supporting switch timing to maintain separate grounds.

FIG. 7 illustrates a preferred embodiment of the present invention incorporated into an image sensor. Utilizing an embedded iSoC timing controller to control the four switches supporting each dual-plate ACM insures that they are never connected at the same time, the ground domain for low-speed block 100 is kept separate from the ground domain for high-speed block 200. It is also clear from the diagram that the arrangement of the present invention is pseudo-differential rather than fully differential, nevertheless it is also applicable to a fully differential configuration. This architectural choice insures that the noise floor is at the lowest possible level achievable since wideband noise is not coherently added in the signal chain to suppress common mode noise.

The invention alternatively suppresses common mode noise by maintaining separation of the ground domains. Also, since the impedance seen at each terminal of a prior art ACM cell is not the same (both the Column Buffer and the Line Driver use a single-ended configuration), a different impedance is seen from the top plate of the ACM to ground with respect to the one seen from the bottom plate to ground. This difference in impedances previously created a transmission line discontinuity, as seen by the high-speed section. The discontinuity caused reflections that fed back into the high-speed circuitry and also generated excess noise that was supplied to the PGA and ADC by the LD amplifier. The present invention overcomes this problem.

Those skilled in the art will appreciate that various adaptations and modifications of the just described preferred embodiments can be configured without departing from the scope and spirit of the invention. Therefore, it is to be understood that, within the scope of the appended claims, the invention may be practiced other than as specifically described herein.

What is claimed is:

1. An Analog Capacitor Memory (ACM) cell comprising:
    a capacitor having a first node and a second node;
    a first switch connected to the first node;
    a second switch connected to the second node;
    a third switch connected to the first node;
    a fourth switch connected to the second node;
    the first and second switches are connected to a first circuit; and
    the third and fourth switches are connected to a second circuit;
    wherein the first and second switches are closed and the third and fourth switches are open during a first period, and wherein the first and second switches are open, and the third and fourth switches are closed during a second period, such that a ground domain of the first circuit is decoupled from a ground domain of the second circuit; and
    wherein the second switch is opened before the first switch to remove any voltage dependent charge injection, and wherein the fourth switch is opened before the third switch to remove any voltage dependent charge injection.

2. The ACM cell of claim 1, wherein the first and second switches are connected to a first circuit operating at a first frequency.

3. The ACM cell of claim 2, wherein the third and fourth switches are connected to a second circuit operating at a second frequency.

4. The ACM cell of claim 3, wherein the first circuit is a column buffer circuit, and the second circuit is a line driver amplifier circuit, and wherein the first frequency is lower than the second frequency.

5. The ACM cell of claim 1, wherein the first period is a write operation, and the second period is a read operation.

6. The ACM cell of claim 3, wherein the capacitor comprises a Metal-Insulator-Metal capacitor.

7. An image sensor comprising:
    a first circuit operating at a first frequency;
    a second circuit operating at a second frequency;
    a plurality of Analog Capacitor Memory (ACM) cells connecting the first and second circuits, each ACM cell comprising:
        a capacitor having a first node and a second node;
        a first switch connected to the first node;
        a second switch connected to the second node;
        a third switch connected to the first node; and
        a fourth switch connected to the second node;
    wherein the first and second switches are connected to the first circuit, and the third and fourth switches are connected to the second circuit;
    wherein the first and second switches are closed and the third and fourth switches are open during a first period, and wherein the first and second switches are open, and the third and fourth switches are closed during a second period, such that a ground domain of the first circuit is decoupled from a ground domain of the second circuit; and
    wherein the second switch is opened before the first switch to remove any voltage dependent charge injection, and wherein the fourth switch is opened before the third switch to remove any voltage dependent charge injection.

8. The ACM cell of claim 7, wherein the first circuit is a column buffer circuit, and the second circuit is a line driver amplifier circuit, and wherein the first frequency is lower than the second frequency.

9. The ACM cell of claim 7, wherein the first period is a write operation, and the second period is a read operation.

10. The ACM cell of claim 7, wherein the capacitor comprises a Metal-Insulator-Metal capacitor.

11. A method of isolating ground noise between a first circuit and a second circuit in an image sensor, the method comprising:
- connecting the first circuit to the second circuit with at least one Analog Capacitor Memory (ACM) cell, wherein the ACM cell comprises:
  - a capacitor having a first node and a second node;
  - a first switch connected to the first node;
  - a second switch connected to the second node;
  - a third switch connected to the first node; and
  - a fourth switch connected to the second node;
  - wherein the first and second switches are connected to the first circuit, and the third and fourth switches are connected to the second circuit;
- closing the first and second switches and opening the third and fourth switches during a first period; and
- opening the first and second switches and closing the third and fourth switches during a second period;
- wherein the at least one ACM cell isolates the first circuit from the second circuit such that a ground domain of the first circuit is decoupled from a ground domain of the second circuit; and
- wherein the second switch is opened before the first switch to remove any voltage dependent charge injection, and wherein the fourth switch is opened before the third switch to remove any voltage dependent charge injection.

* * * * *